United States Patent [19]

Brakus et al.

[11] Patent Number: 5,852,387

[45] Date of Patent: Dec. 22, 1998

[54] VOLTAGE-CONTROLLED OSCILLATOR THAT OPERATES OVER A WIDE FREQUENCY RANGE

[75] Inventors: Bogdan Brakus, Stockdorf; Heinz-Jürgen Roth, München, both of Germany

[73] Assignees: Siemens Aktiengesellschaft, Munich; SGS-Thomson Microelectronics GmbH, Grasbrunn, both of Germany

[21] Appl. No.: 817,842

[22] PCT Filed: Oct. 17, 1995

[86] PCT No.: PCT/DE95/01439

§ 371 Date: Apr. 25, 1997

§ 102(e) Date: Apr. 25, 1997

[87] PCT Pub. No.: WO96/13899

PCT Pub. Date: May 9, 1996

[30] Foreign Application Priority Data

Oct. 28, 1994 [DE] Germany ............... 44 38 670.2

[51] Int. Cl.⁶ .................. H03K 3/023; H03K 3/00
[52] U.S. Cl. ............. 331/111; 331/143; 331/177 R; 331/175
[58] Field of Search .................. 331/111, 176, 331/108 C, 177 R, 175, 143

[56] References Cited

U.S. PATENT DOCUMENTS

| 4,233,575 | 11/1980 | Chapman et al. | 331/111 |
| 4,983,931 | 1/1991 | Nakano | 331/111 |
| 5,418,502 | 5/1995 | Ma et al. | 331/111 |
| 5,668,508 | 9/1997 | Pulvirenti et al. | 331/111 |

FOREIGN PATENT DOCUMENTS

| 0 407 269 A1 | 1/1991 | European Pat. Off. |
| 3 416 611 C2 | 10/1985 | Germany . |
| 3 613 504 C1 | 4/1987 | Germany . |
| 3 800 511 C1 | 2/1989 | Germany . |
| 2 090 091 | 6/1982 | United Kingdom . |

OTHER PUBLICATIONS

Radio Fernsehen Elektronik, vol. 38, No. 1, (1989), Horst Juengling, "Spannungsgesteuerter Funktionsgenerator IA 338 D", pp. 8–12.

The Macrochip, Design Manual, (1987), Feranti Interdesign, Inc., Scotts Valley, California, p.1.

*Primary Examiner*—Arnold Kinkead
*Attorney, Agent, or Firm*—Hill & Simpson

[57] ABSTRACT

A controllable oscillator having a comparison unit, upstream of whose signal input an impedance converter is connected, and having two current mirror circuits which are provided as current sources and via which the oscillator frequency and the output impedance of the impedance converter are controlled. The range of adjustment of the oscillator frequency is expanded by the controlled output impedance.

7 Claims, 4 Drawing Sheets

VOLTAGE-CONTROLLED OSCILLATOR THAT OPERATES OVER A WIDE FREQUENCY RANGE

BACKGROUND OF THE INVENTION

The invention relates to a circuit arrangement, of a controllable oscillator. A circuit arrangement of this type is disclosed, for example, in The Macrochip, Design Manual, 1987, Feranti Interdesign, Inc. Scotts Valley, Calif., page 1. However, this circuit arrangement has the disadvantage of increasing inaccuracy between a frequency-setting adjusting variable and an expected oscillator frequency, in particular at low and high frequencies.

SUMMARY OF THE INVENTION

The object of the invention is to design a voltage-controlled oscillator in such a way that it is suitable for a large frequency range.

In general terms the present invention is a controllable oscillator having a comparator unit for comparing the voltage potential, fed to its signal inputs, of a storage element with first and second reference voltage potentials. A control stage which is connected to the comparison unit and, under the control of the latter, defines a charging and discharge cycle via a switching unit. Two current mirror units, designed as controlled current sources, charge and discharge the storage element. An adjusting current is fed in via an input of the first current mirror unit, a first output being connected to the storage element and a second output being connected to an input of the second current mirror unit. As a result the oscillator frequency is controlled by the adjusting current via the first and second current mirror units. An impedance converter is provided whose input is connected to the storage unit and whose output is connected to the signal input of the comparison unit. The second output of the first current mirror unit is connected directly to the input of the second current mirror unit, the first output of which is connected to the storage element via the switching unit and the second output of which is likewise connected to the signal input of the comparison unit. The emitter of the impedance converter is connected to a current source whose output current is proportional to the adjusting current.

Advantageous developments of the present invention are as follows.

The current mirror unit has at least two transistors, which are interconnected by their base terminals, and one diode connected to there terminals.

The comparison unit is a window comparator formed from first and second comparators.

An impedance converter is provided, at whose input a first reference voltage potential is present and whose output is connected to a reference voltage input of the first comparator. A second impedance converter is provided, at whose input a second reference voltage potential is present and whose output is connected to a reference voltage input of the second comparator. The second controllable current source has two further outputs, which are respectively connected to an output of the first and second impedance converters.

The control stage provided has a bistable multivibrator which is controlled by the output signals of the window comparator.

A level adapting unit is provided, via which the output signal of the bistable multivibrator is fed to the switching unit.

A current subtraction unit is provided, to which a constant maximum current and at least one control current are fed and which outputs the adjusting current at its output.

The invention has the advantage that the currents influencing the oscillator frequency are used exclusively to charge and discharge the storage unit of the oscillator and the oscillator is particularly suitable for producing very large and extremely small repetition rates.

A further advantage of the circuit arrangement is that with a reduction in the repetition rate, the current consumption of the circuit arrangement specified decreases and a favorable efficiency is produced in conjunction with a low power requirement.

The circuit arrangement has the further advantage that the repetition rate can be set within very wide ranges.

A further advantage of the circuit arrangement is that it can be embodied in an integrated circuit and requires very few external components.

A further advantage of the circuit arrangement is that it is temperature-compensated and operates in the unsaturated mode, thereby yielding high frequency stability.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
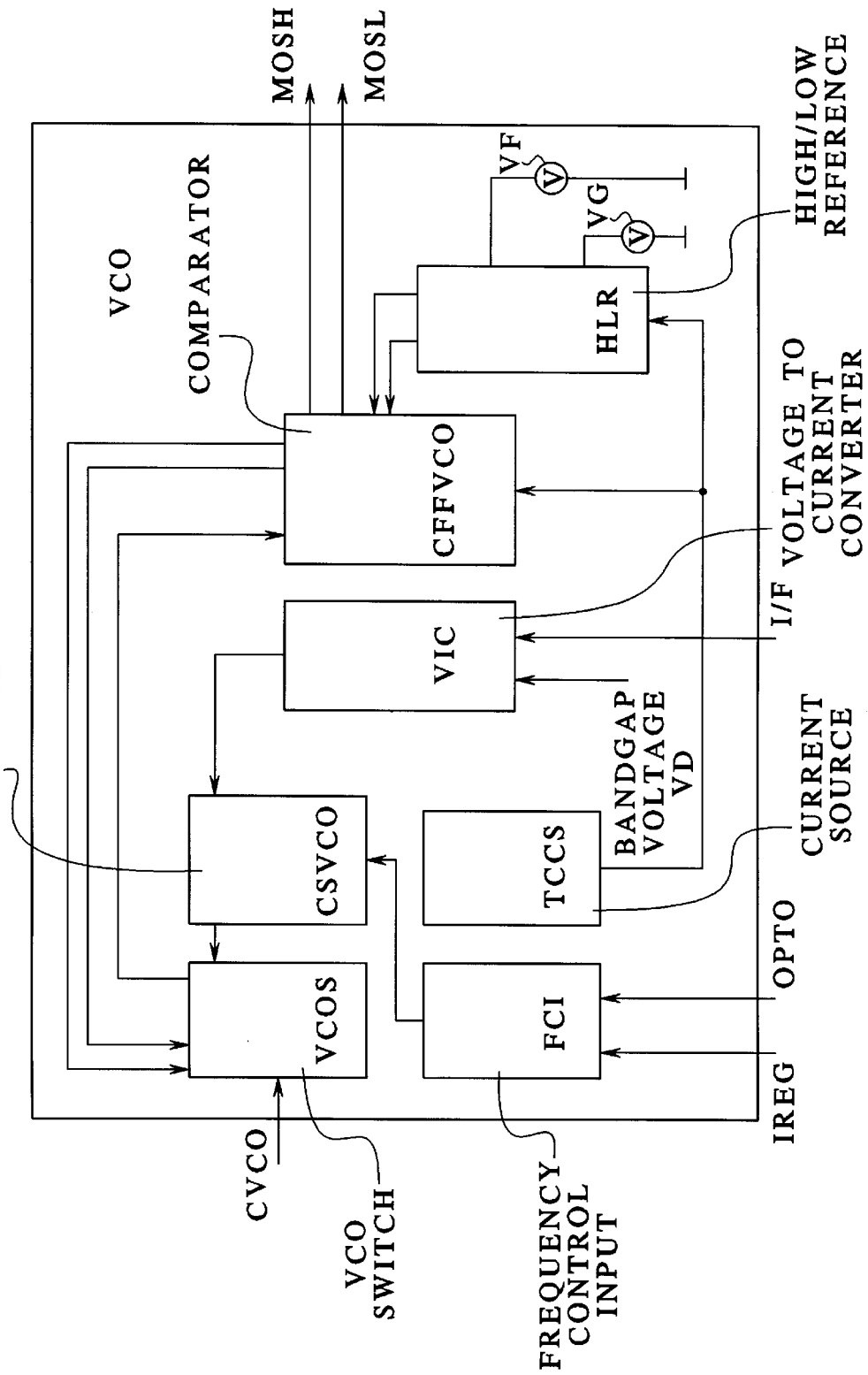
FIG. 1 shows a diagrammatic illustration of an oscillator.
Figure 2:
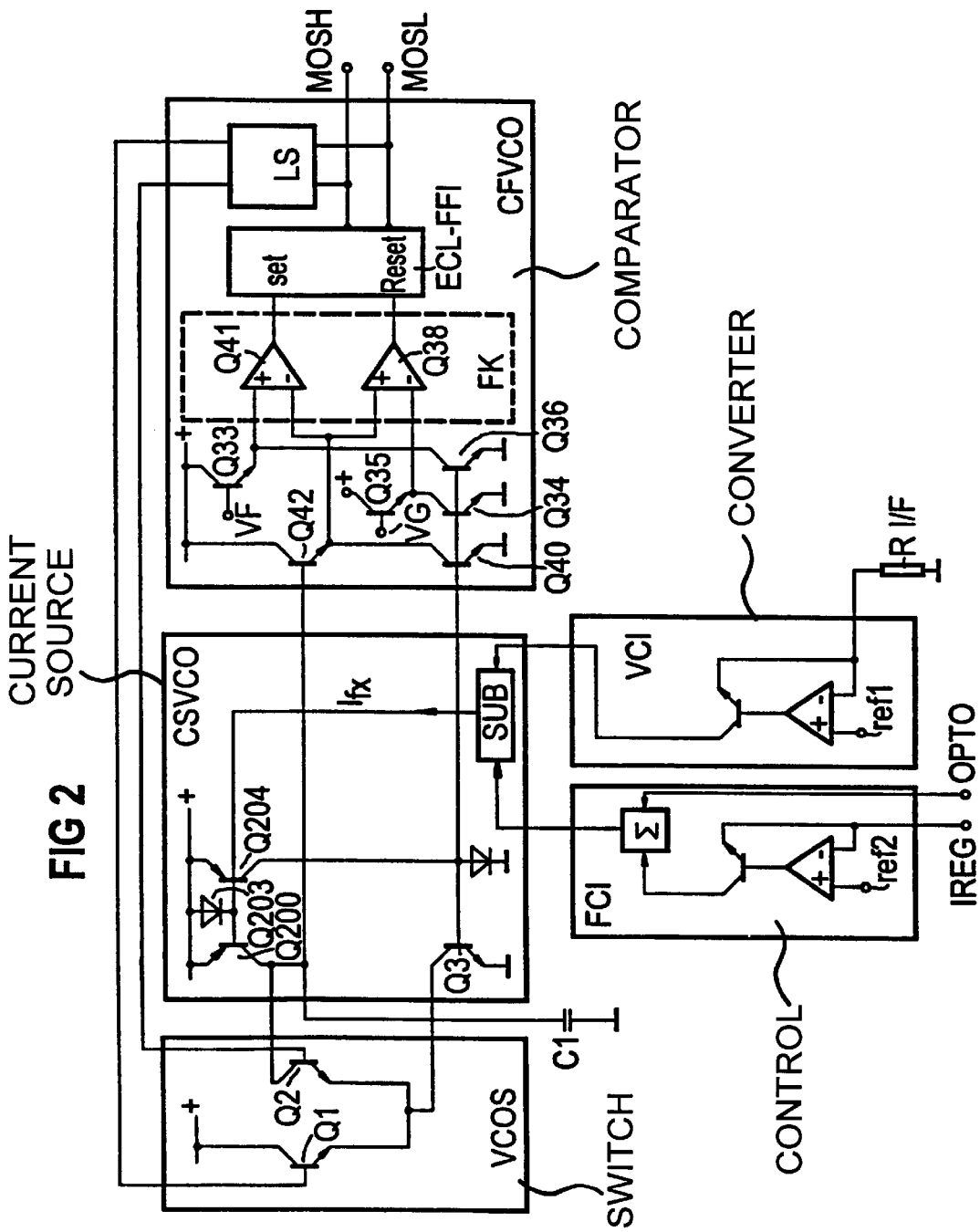
FIG. 2 shows a configuration of the oscillator.

The subject matter of the invention will be explained below with reference to the block diagram in FIG. 1 and a simplified circuit embodiment as is illustrated in FIG. 2. This circuit arrangement is particularly suitable for driving an electronic switch which may be arranged in the main circuit of a converter.

In detail, the following circuits are arranged in this controllable oscillator VCO in FIG. 1:
FCI: Frequency Control Input,
VCOS: VCO Switch,
CSVCO: Current Source VCO,
TCCS: Temperature Compensated Current Source,
VIC: Voltage to Current Converter,
CFFVCO: Comparator CO, ECL Flip-Flop ECL-FF1,
HLS: High/Low Reference.
Individual circuits are provided with control terminals. The frequency of the output signal of the controllable oscillator can be influenced via these control terminals.
CVCO: Capacitor terminal of C1 for determining the maximum clock frequency,
IREG: Adjusting input for reducing the frequency with an internal threshold set by the reference voltage designated by ref1,
OPTO: Current adjusting input for reducing the frequency
I/F: Setting of the maximum frequency in connection with the capacitor connected to the terminal CVCO.

The circuit structure shown in the diagrammatic illustration in FIG. 1 makes it possible to operate with small powers and high frequencies and to change the frequency over wide ranges. Thus, for example, fast transistors having a transition frequency of 6 GHz have been employed, the transistors operating in the unsaturated mode. This entails the advantage that the power consumption of the circuit arrangement is kept low at a high switching frequency. In order to change the frequency in a wide range and make it independent of temperature, the arrangement operates with temperature-compensated currents which can be varied over a plurality of decades. In order to implement storage and control functions, use is made of a supervisory circuit section ECL-FF1 in the VCO, which operates at constant differential levels. In order to achieve matching of the input currents of the supervisory circuit section when the frequency is reduced, the input impedance of said supervisory circuit section is continually adapted.

FIG. 2 shows a circuit embodiment which is simplified for an understanding of the invention.

In the following text, the circuit arrangement is described for the case where no adjusting request is present at the adjusting inputs OPTO and IREG. Since no adjusting request is present at the adjusting inputs, the oscillator VCO supplies an output signal at the maximum frequency VCOfmax. The maximum frequency is determined by a capacitor C1, a resistor R I/F as well as an upper potential threshold, predetermined by a first reference voltage VF, and a lower potential threshold, predetermined by a second reference voltage VG. The maximum adjusting current is mirrored at the current mirror Q203 I/Fmax.

By means of the switch VCOS designed as a differential stage Q1, Q2, the capacitor C1 is charged via the transistor Q200 acting as a current source and is discharged via the transistor Q3 acting as a current source. The current sources Q200 and Q3 are selected such that a sawtooth oscillation having a desired period is established at the capacitor C1. The voltage potential across the capacitor C1 is forwarded via an impedance converter Q42 to the comparator input of a window comparator FK formed from two comparators Q41, Q38. The window comparator FK compares the voltage potential across the capacitor C1 with the first reference voltage VF present at the comparator Q41 or with the second reference voltage VG present at the second comparator.

The output signals of the window comparator Q41, Q38 effect a set and reset, respectively, at a flip-flop ECL-FF1. By means of the switching unit Level-Shift LS, formed by the transistors Q45 . . . Q50, the charging operation or discharge operation of the capacitor C1 is ended by means of the switch Q1, Q2 when the first or second reference voltage VF, VG is reached, and the discharge operation or charging operation is begun. The output of the flip-flop ECL-FF1 or likewise supplies the ECL output signals MOSH, MOSL of the overall circuit of the controllable oscillator VCO. This output signal MOSH, MOSL can be used, for example, to drive a switch, a power MOS transistor, arranged in a main circuit of a converter. In the following text, the functioning of the circuit is described when, due to adjusting requirements via the terminals IREG or OPTO, the frequency of the output signal of the voltage-controlled oscillator VCO is to be influenced. The two adjusting currents are combined in the switching unit FCI. The maximum possible adjusting current I Fmax is in each case reduced by the sum of the adjusting currents IREG, OPTO (Q208, Q70 and current mirror Q203). The period of the sawtooth oscillation, which is a function of this current, is likewise reduced proportionally to the current reduction.

Since the sawtooth-waveform voltage across the capacitor C1 is interrogated by means of a window comparator FK having an upper and lower threshold (first and second reference voltage) VF, VG, the input impedance of the window comparator FK would limit an increase in the period since the input current of the window comparator FK would come in the range of the charging and discharge current of C1. In order to avoid this, the input impedance of Q41, Q38 is continually adapted to the operating frequency of the VCO via Q42/Q40, Q33/Q36, Q35/Q37. The input impedance is adapted by means of the current interrogation of the VCO, in that an actual current for adjusting the frequency of the voltage-controlled oscillator VCO is simultaneously fed via Q10 to the impedance converter of the window comparator FK as well. This has the advantage that, for large actual currents of the VCO, the impedance converter stage is fast owing to the consequently large mirror current Q40, Q37, Q36 and, on the other hand, for small actual currents of the VCO, the base current into Q42 is correspondingly reduced. As a result, the base current of Q42, when considered in the context of the frequency adjustment of the VCO, represents a likewise proportional variable in wide ranges, since the emitter current of Q42 is obtained directly from the actual current adjusting variable.

Figure 3:
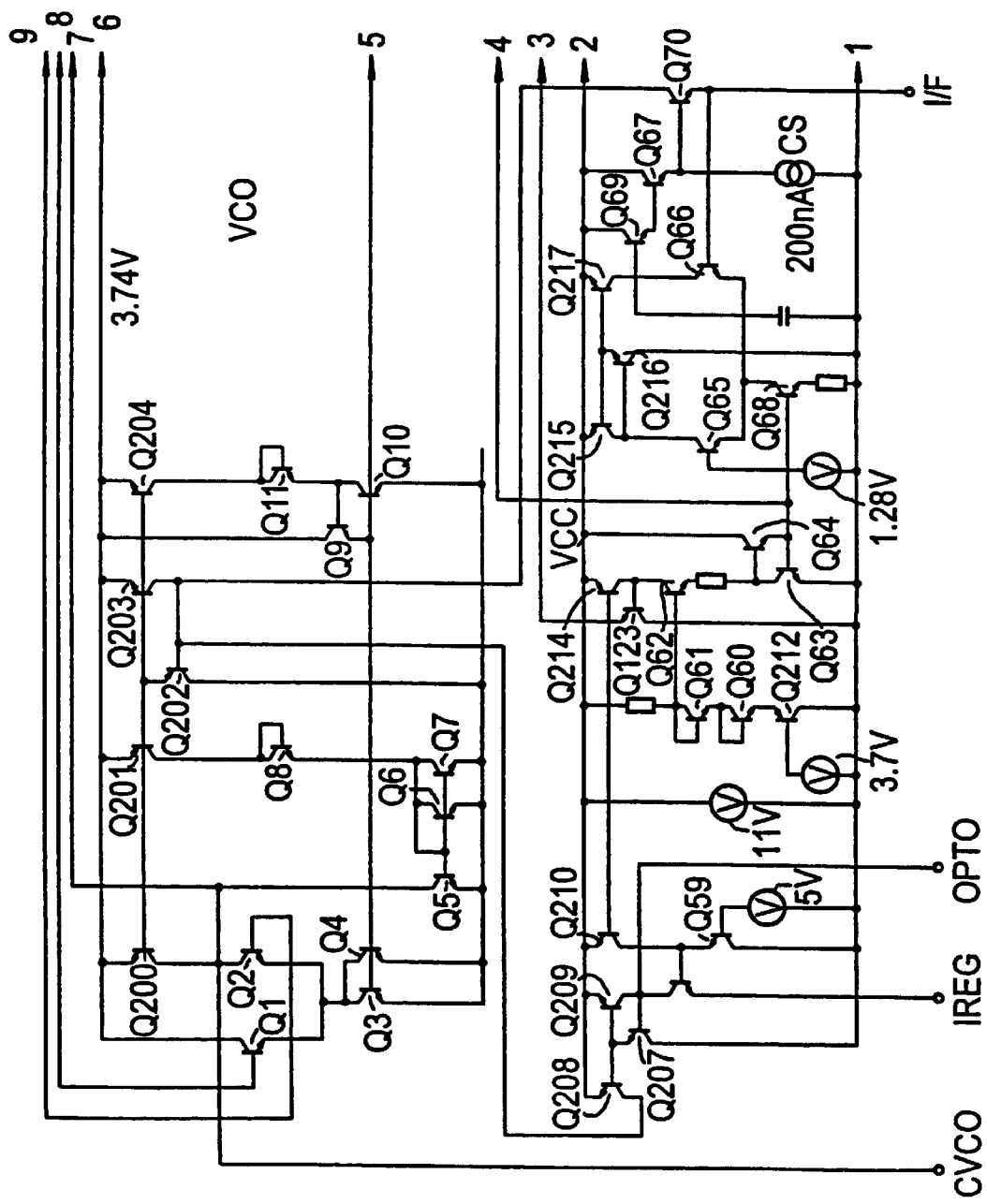
FIGS. 3, 4 show a detailed illustration of the oscillator.
Figure 4:
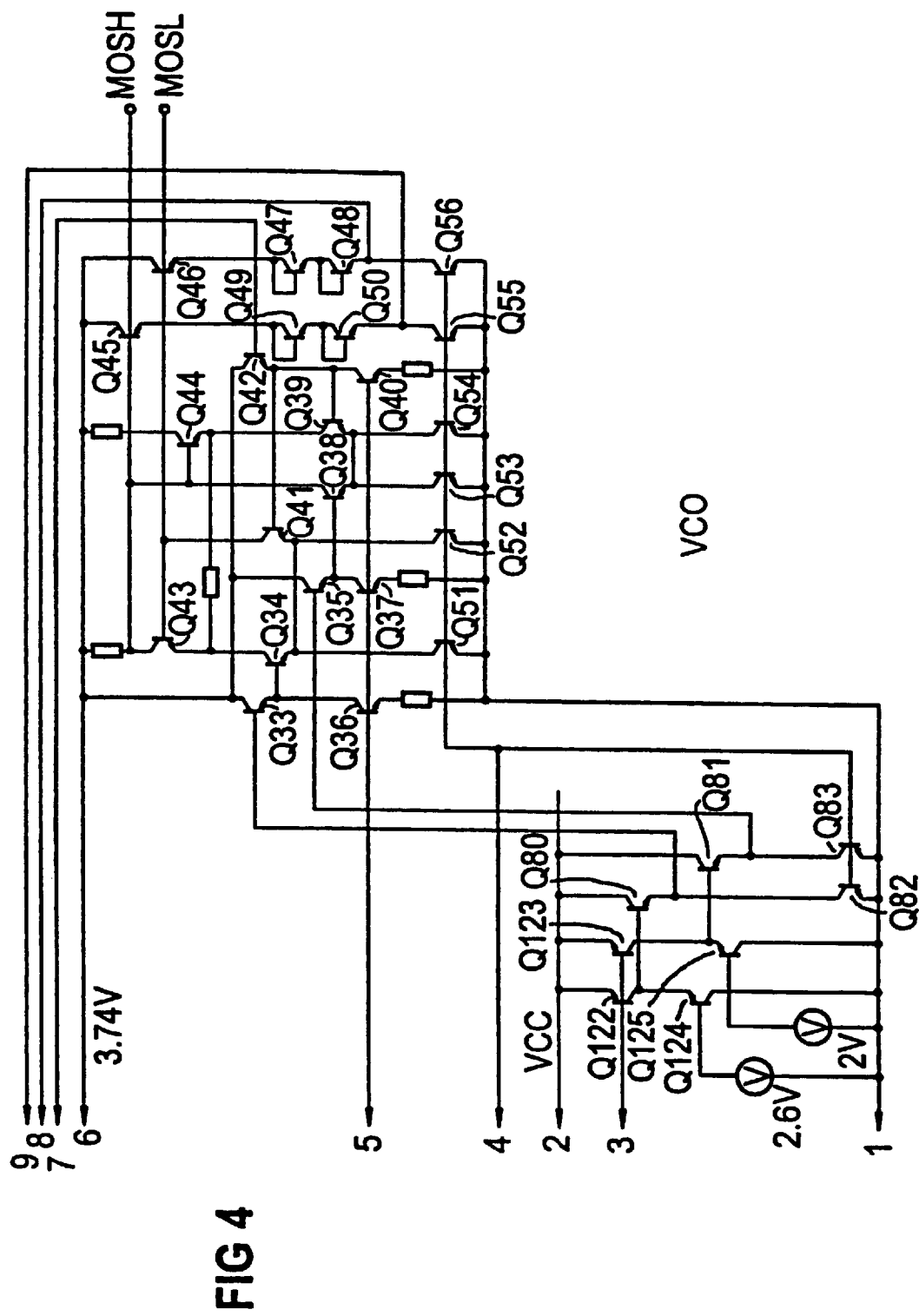

FIGS. 3 and 4 portray a detailed circuit arrangement of the simplified illustration shown in FIG. 2. The method of operation of the circuit arrangement is described below:

Voltage to current conversion is carried out at the terminal I/F of the switching component VIC by means of the transistors Q70, Q71. The effect achieved by a buffer circuit formed by the transistors Q65 . . . Q71, Q215 . . . Q217 and the voltage source VD, which is designed as a band gap, is that the current extracted by the transistors Q70, Q71 is independent of temperature and, as a result, the frequency does not change over the temperature range.

The current which flows in the collector of Q70 is fed to the current mirror of CSVCO Q200 . . . Q204. The transistors Q200 . . . Q204 form together with Q3 . . . Q11 the current generator for the variable-frequency operation.

The charge reversal of CSVCO is effected by means of the VCOS, which is formed by the transistors Q1, Q2. A differential voltage is present at the bases of the transistors Q1, Q2. Depending on the drive level of the bases, CSVCO is charged via Q200 or discharged via Q3, Q4, since the discharge current, which is generated in Q204, is mirrored in the ratio 2:1 (transistors Q9, Q10, Q3, Q4). The voltage of the CSVCO has a sawtooth waveform. The magnitude of the sawtooth amplitude produced in the CSVCO is defined by the reference voltages VF and VG which are fed via the transistors Q124, Q122, Q80 and, respectively, Q125, Q123, Q81 to the VCO (comparator CO/ECL-flip-flop frequency). The reference voltages are connected via Q33 and Q35 to the comparator, ECL flip-flop/frequency, which, via Q42, compares the voltage across the VCO with these reference or threshold voltages VF, VG. If VCOS reaches the upper or lower value of the reference voltage, there takes place, when VF is reached via Q41, reset or, when VG is reached via Q38, set at the flip-flop Q43, Q44. A differential signal of 320 mV is produced at the flip-flop transistors Q43, Q44 due to the selection of the current in the current sources Q51, Q52, Q53, Q54 and the collector resistances of 3.3 K, which differential signal switches over the switch Q1, Q2 in the VCOS via Q45 . . . Q50.

The special feature of the previously described circuits emerges from the structure of the input circuit, which, via Q36, Q37, Q40, mirrors the current from the current mirror Q9, Q10 into the input stages of the comparator. This yields the advantage that the input current at the base of Q42 is made dependent on the current in the VCO changeover switch Q1, Q2 and, consequently, in the event of a frequency variation at the terminal VCO in the ratio 1:100, this base current is altered by the same ratio, as a result of which the Darlington stage Q42, Q39, Q41 is matched in speed to the VCO frequency.

Since the current sources Q51 ... Q56 operate with the fixedly set current, the Darlington input transistors Q33/Q34, Q35/Q38, Q42/Q41, Q42/Q39 permit the impedance adaptation to the VCO current and the conversion to constant ECL levels in the collectors Q43, Q44.

The frequency is set by means of the following circuit configuration: given the mirror ratio of the transistors which is implemented in the circuit example, the maximum frequency of the VCO can be determined by the current set at the terminal I/F, the magnitude of the amplitude, of the sawtooth-waveform voltage swing VF-VG, and the size of the capacitor at the terminal VCO. The times t1, t2 which can be used to determine the frequency of the VCO can be calculated in the manner evinced below:

$$t1 = \frac{C_{VCO} \cdot 0.6}{\frac{1.26}{R_{IF} \cdot 2}} \ [s] \tag{1}$$

$$t2 = \frac{C_{VCO} \cdot 0.6}{\frac{1.26 \cdot 0{,}774}{R_{IF} \cdot 2}} \ [s] \tag{2}$$

the frequency of the VCO:

$$F_{VCO} = \frac{1}{t1 + t2} = \frac{0{,}458}{C_{VCO} \cdot R_{IF}} \ [Hz] \tag{3}$$

VF-VG=0.6 V sawtooth-waveform voltage swing VD=1.26 V (band gap voltage)
$R_{I/F}$: Resistance at the terminal I/F
$f_{VCO}$: Frequency of the voltage-controlled oscillator The frequency can be set via the terminals IREG and OPTO at the circuit FCI.

The current mirror Q208, Q209 mirrors, in the collector of Q208, the current flowing from the terminals IREG or OPTO in such a way into the current mirror Q200 ... Q204 that the current of collector Q208 and Q70 are substractively superposed. If the value of the current of collector Q208 reaches the value of the current of collector Q70, the current mirror Q200 ... Q204 becomes free from current and the frequency at the terminal VCO is zero.

The following relationship is given here:

$$t1_{opto/ireg} = \frac{C_{VCO} \cdot 0.6}{\frac{1.26}{R_{IF} \cdot 2} - I_{opto} - I_{opto}} \ [s] \tag{4}$$

$$t2_{opto/ireg} = \frac{c_{VCO} \cdot 0.6}{\left(\frac{1.26}{R_{IF} \cdot 2} - I_{opto} - I_{opto}\right) \cdot 0.774} \ [s] \tag{5}$$

$$f_{VCOopto/ireg} = \frac{1}{t1_{opto/ireg} + t2_{opto/ireg}} \tag{6}$$

$t1_{opto/ireg}$: Discharge time of the capacitor CVCO at the terminal VCO in the event of adjustment at the terminals OPTO or IREG $t2_{opto/ireg}$: Charging time of the capacitor CVCO at the terminal VCO in the event of adjustment at the terminals OPTO or IREG $f_{VCO\ opto/ireg}$ Frequency of the VCO in the event of active terminals OPTO or IREG This type of frequency setting provides a large range of frequency variation. In the integrated circuit embodiment, it is possible to realize a frequency variation of more than 1:300.

The inputs OPTO and IREG are combined at the collector of the transistor Q209 and act as an OR circuit on the frequency adjustment. The input OPTO can, for example, carry out a supervisory function of the secondary side of a converter via an optocoupler and the maximum current of a power transistor on the primary side can be monitored via the input IREG.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A controllable oscillator circuit arrangement, comprising:

a comparator unit for comparing voltage potential, fed to a signal input thereof, of a storage element with a first reference voltage potential and a second reference voltage potential;

a control stage connected to the comparator unit and which, under control of the comparator unit, defines a charging and discharge cycle via a switching unit;

first and second current mirror units, structured as first and second controlled current sources, for charging and discharging the storage element;

an adjusting current being fed in via an input of the first current mirror unit and a first output thereof being connected to the storage element and a second output thereof being connected to an input of the second current mirror unit;

an oscillator frequency of the controllable oscillator being controlled by the adjusting current via the first and second current mirror units;

an impedance converter having an input connected to the storage unit and having an output connected to the signal input of the comparator unit;

the second output of the first current mirror unit connected directly to the input of the second current mirror unit, a first output of the second current mirror unit connected to the storage element via the switching unit and a second output of the second current mirror unit connected to the signal input of the comparator unit; and an emitter of the impedance converter connected to a current source whose output current is proportional to the adjusting current.

2. The circuit arrangement as claimed in claim 1, wherein the first current mirror unit has at least two transistors, which are interconnected by their base terminals, and one diode connected to said base terminals.

3. The circuit arrangement as claimed in claim 1, wherein the comparator unit is a window comparator formed from a first comparator and a second comparator.

4. The circuit arrangement as claimed in claim 3, wherein the arrangement further comprises:

an impedance converter, at an input thereof a first reference voltage potential is present and an output thereof being connected to a reference voltage input of the first comparator;

a second impedance converter, at an input thereof a second reference voltage potential is present and an output thereof being connected to a reference voltage input of the second comparator;

wherein the second controlled current source has two further outputs, which are respectively connected to outputs of first and second impedance converters.

5. The circuit arrangement as claimed in claim 1, wherein the control stage has a bistable multivibrator which is controlled by output signals of the comparator unit.

6. The circuit arrangement as claimed in claim 5, wherein the circuit arrangement further comprises a level adapting unit, via which an output signal of the bistable multivibrator is fed to the switching unit.

7. The circuit arrangement as claimed in claim 1, wherein the circuit arrangement further comprises a current subtraction unit, to which a constant maximum current and at least one control current are fed and which outputs the adjusting current at an output of the current subtraction unit.

\* \* \* \* \*